(12) United States Patent
Theis

(10) Patent No.: US 9,293,327 B2
(45) Date of Patent: Mar. 22, 2016

(54) METHOD FOR PRODUCING SEMICONDUCTOR THIN FILMS ON FOREIGN SUBSTRATES

(71) Applicant: Jean-Paul Theis, Erpeldange (LU)

(72) Inventor: Jean-Paul Theis, Erpeldange (LU)

(73) Assignee: Solar Carbide S.à.r.l., Erpeldange (LU)

( * ) Notice: Subject to any disclaimer, the term of this patent is extended or adjusted under 35 U.S.C. 154(b) by 0 days.

(21) Appl. No.: 14/406,566

(22) PCT Filed: Jun. 17, 2013

(86) PCT No.: PCT/EP2013/062481
§ 371 (c)(1),
(2) Date: Dec. 9, 2014

(87) PCT Pub. No.: WO2013/189873
PCT Pub. Date: Dec. 27, 2013

(65) Prior Publication Data
US 2015/0140795 A1  May 21, 2015

(30) Foreign Application Priority Data

Jun. 18, 2012 (DE) .......................... 10 2012 012 088

(51) Int. Cl.
| | |
|---|---|
| *H01L 21/02* | (2006.01) |
| *C30B 25/02* | (2006.01) |
| *C30B 29/36* | (2006.01) |
| *C30B 33/02* | (2006.01) |

(52) U.S. Cl.
CPC .......... *H01L 21/02672* (2013.01); *C30B 25/02* (2013.01); *C30B 29/36* (2013.01); *C30B 33/02* (2013.01); *H01L 21/0237* (2013.01); *H01L 21/0245* (2013.01); *H01L 21/0262* (2013.01); *H01L 21/02376* (2013.01); *H01L 21/02521* (2013.01); *H01L 21/02529* (2013.01); *H01L 21/02598* (2013.01); *H01L 21/02667* (2013.01)

(58) Field of Classification Search
CPC ............ H01L 21/02595; H01L 21/324; H01L 21/182; H01L 21/02667; H01L 21/02625; H01L 21/763; H01L 21/02; H01L 21/02672; H01L 21/0262; H01L 21/02529; H01L 21/02598; H01L 25/00
USPC ......... 438/488, 308, 378, 463, 535, 540, 502, 438/795, 799, 754, 756, 285
See application file for complete search history.

(56) References Cited

U.S. PATENT DOCUMENTS

| | | | |
|---|---|---|---|
| 5,387,067 A | 2/1995 | Grunes | |
| 5,715,361 A | 2/1998 | Moslehi | |
| 2004/0224469 A1* | 11/2004 | Lim et al. ....................... | 438/285 |
| 2008/0142763 A1* | 6/2008 | Rana et al. ................. | 252/501.1 |

FOREIGN PATENT DOCUMENTS

| | | |
|---|---|---|
| DE | 1223951 | 9/1966 |
| DE | 1521465 | 7/1969 |
| DE | 2536174 | 3/1977 |
| DE | 4140555 A1 | 8/1992 |
| DE | 4135076 A1 | 4/1993 |
| EP | 2190033 A1 | 5/2010 |

OTHER PUBLICATIONS

N. Tétreault et al: 'Silicon Inverse Opal-A Platform for Photonic Bandgap Resarch', Advanced Materials, vol. 16, No. 16, Aug. 18, 2004, pp. 1471-1476, XP055078815, ISSN: 0935-9648, DOI: 10.1002/adma.200400618 *Abschnitt '4. CVD Infiltration'.
Search Report for DE 10 2012 012 088.5 dated Jun. 18, 2012.
International Search Report for PCT/EP2013/062481 dated Dec. 3, 2013.

* cited by examiner

*Primary Examiner* — Chuong A Luu
(74) *Attorney, Agent, or Firm* — Dennemeyer & Associates, LLC.

(57) ABSTRACT

The invention relates to a method by means of which the average single crystal size, in particular the diameter of the single crystals, in a semiconductor thin film applied to a foreign substrate can be increased by an order of magnitude with respect to prior methods. The method is characterized in that a thin semiconductor film is applied to the foreign substrate in a first step. Then the foreign substrate is heated to such an extent that the semiconductor thin film melts. Then the temperature is slowly decreased to below the melting temperature of the semiconductor material. During the cooling process, the foreign substrate is heated in such a way that, proceeding from the surface of the foreign substrate, the temperature continuously decreases in a vertical direction perpendicular through the semiconductor thin film to the surface of the thin film. It is thereby ensured that the thin film crystallizes, or rather solidifies, in the opposite direction during the slow decrease of the temperature to below the melting temperature of the semiconductor thin film. In other words, the atom layers directly at the exposed surface of the thin film crystallize first, then the next deeper atom layers crystallize, etc., until finally the atom layers in the immediate vicinity of the surface of the foreign substrate crystallize. The atom layers directly at the exposed surface of the thin film can freely orient themselves without interference during the crystallization, whereby the formation of extensive single crystals several atom layers thick is promoted. Said extensive single crystals are then used as growth nuclei for the next deeper atom layers in such a way that said extensive single crystals grow in thickness in the direction of the surface of the foreign substrate. Only the atom layers in the immediate vicinity of the surface of the foreign substrate are interfered with during the crystallization and degrade into an amorphous or polycrystalline boundary layer. In order to ensure the aforementioned temperature course perpendicular through the thin film, either a heat source applied to the underside of the foreign substrate in a planar manner or heating of the foreign substrate by means of electric current passage must be selected as the heating type. The method is suitable in particular for producing highly efficient thin film solar cells. The method is also suitable for high-quality annealing of high-temperature semiconductor thin films.

9 Claims, 4 Drawing Sheets

METHOD FOR PRODUCING SEMICONDUCTOR THIN FILMS ON FOREIGN SUBSTRATES

The main objective in the production of semiconductor thin films on foreign substrates, such as metal, glass, ceramics, or graphite, for example, is to produce a thin film having semiconductor single crystals which are as large as possible. The size, i.e. diameter and thickness, of the semiconductor single crystals significantly determines the quality of the thin film, in particular in thin film solar cells where the single crystal size has a direct influence on the efficiency of the solar cells.

The different crystal structure of the foreign substrate and the semiconductor tends to interfere with the formation or growth of preferably large semiconductor single crystals in the thin film. Consequently, a suitable production method has to keep said adverse influence at a minimum.

Prior methods mostly consist of applying a polycrystalline semiconductor material to the foreign substrate by a PVD (Physical Vapor Deposition), CVD (Chemical Vapor Deposition), or PECVD (Physically Enhanced CVD) method, and subsequently enhancing the average single crystal size of the thin film by means of a zone melting method or healing (annealing) of the thin film at increased temperature. In spite of intensive research, so far none of said methods has been able to obtain an average single crystal size exceeding a diameter of several mm and a thickness of about 50 μm.

The invention suggests a method by which the average single crystal size, in particular the diameter of the single crystals, in the thin film can be increased economically by one order of magnitude.

The inventive method is characterized by the combination of the following steps:

a) on a foreign substrate, a thin layer of polycrystalline semiconductor material is applied;

b) the foreign substrate is heated to such an extent that the semiconductor thin film melts at a temperature which is higher than the melting temperature of the semiconductor thin film, whereafter the temperature is slowly decreased to below the melting temperature of the semiconductor thin film and to solidification of the semiconductor thin film, and then further decreased to the normal temperature;

c) while the temperature is decreased to below the melting temperature of the semiconductor thin film, the foreign substrate is heated so that the temperature, starting from the contact surface of the foreign substrate with the thin film, continuously decreases in the vertical direction straight through the semiconductor thin film up to the surface of the thin film.

Step c) is decisive for the formation of single crystals which are as large as possible. In that the temperature, starting from the contact surface of the foreign substrate with the thin film, continuously decreases in the vertical direction straight through the semiconductor thin film up to the surface of the thin film, it is ensured, when the temperature is slowly decreased to below the melting temperature of the semiconductor thin film, that the thin film crystallizes or solidifies in the opposite direction. I.e., first the atom layers directly on the exposed surface of the thin film crystallize, then the next deeper atom layers, etc., until at last the atom layers in close proximity to the contact surface with the foreign substrate crystallize. Herein, the atom layers directly on the exposed surface of the thin film may freely orient themselves during crystallization without any interference, whereby the formation of extensive single crystals having a thickness of several atom layers is promoted. In this case, they act as growth nuclei for the next deeper atom layers so that said extensive single crystals grow in thickness towards the contact surface with the foreign substrate. Only the atom layers in close proximity to the contact surface with the foreign substrate are hindered in crystallization and degrade into an amorphous or polycrystalline boundary layer. Slowly decreasing the temperature to below the melting temperature of the semiconductor material is achieved and ensured by adequate reduction of the heating power.

BRIEF DESCRIPTION OF THE DRAWINGS

FIG. 1 shows the temperature curve described in step c) of the invention above the coordinate x straight through the semiconductor thin film 20 at a time t1 when the entire semiconductor thin film has melted, and at a later time t2 while temperature T is slowly decreased to slightly below the melting temperature Tc when the surface of the thin film begins to solidify. Also shown is the direction of growth 12 of the single crystals from the surface towards the foreign substrate 30. When the temperature is decreased, the crystallization front 10 divides the semiconductor thin film 20 into two regions: a solidified monocrystalline region 25 and the remaining region of the semiconductor thin film which is still liquid.

Figure 1:
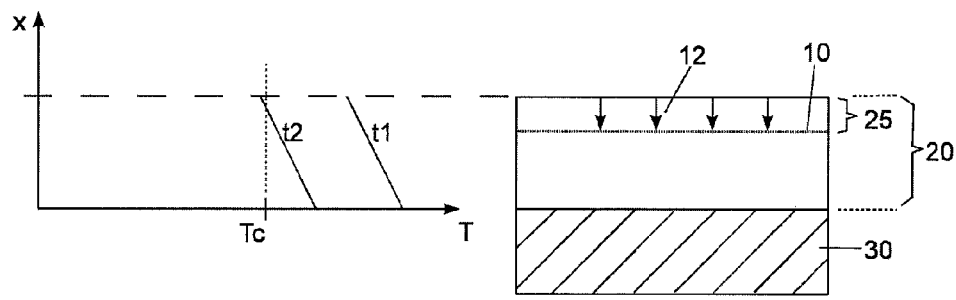
FIG. 1 is illustrative of a temperature curve through the semiconductor thin film of the present invention.

For step c) of the invention, it is mandatory for the temperature of the foreign substrate during cooling to be always higher than the temperature of the thin film. In principle, there are two options to achieve this:

1. If the foreign substrate consists of a thin plate or sheet and is coated on one side with a thin film, then this can only be achieved in that a heat source is attached in a planar fashion directly to the uncoated surface of the foreign substrate, or in that the foreign substrate is heated by direct electric current passage.

2. If the foreign substrate consists of a thin plate or sheet and is coated on both sides, or the foreign substrate consists of a solid or hollow with an external surface only, e.g. a sphere, then this can be achieved in that heat is applied to the foreign substrate and the thin film by a heat source from the outside. Once the desired temperature has been reached, the heating power can be reduced. Upon cooling, a temperature curve straight through the thin film which fulfills step c) of the invention will then be apparent.

The arrangement according to item 2 has not yet been described in literature or embodied by an adequate apparatus. All of the methods described in literature so far thus refer to a one-side coated foreign substrate and are characterized in that steps b) and c) of the invention are never fulfilled at the same time. Step c) of the invention cannot be fulfilled if the heating or heat source is applied or transferred to the thin film from the outside, e.g. by high-frequency heating, induction heating, resistance heating, and zone melting methods, as well as in cylindrical CVD reactors by heating of the reactor wall (hot wall reactor). In these types of heating, during warm-up, the usually gaseous environment is at a higher temperature than the semiconductor thin film and the foreign substrate. Now, if the heating power is reduced for cooling, then the temperature gradient is inverted, i.e. the temperature continuously decreases from the inside of the thin film towards the exposed surface of the thin film and towards the foreign substrate. As a result, when the temperature is decreased to below the melting temperature of the semiconductor thin film, first the atom layers on the exposed surface of the thin film and simultaneously close to the foreign substrate crystallize or solidify. I.e., the direction of growth of the crystals proceeds at the same time from the exposed surface of the thin film and the contact surface of the foreign substrate with the thin film towards the inside of the thin film. Thus, two crystallization fronts appear towards the inside of the thin film which meet upon cooling, and divide the thin film into two regions of different crystal structures. The crystals, which first form in close proximity to the foreign substrate, are hindered in growth by the foreign substrate and form small-surface single crystals growing in thickness towards the inside of the thin film, but not in surface. The result is a polycrystalline crystal structure in this region of the thin film. By contrast, as described above, the crystals forming first on the exposed surface of the thin film and growing towards the inside of the thin film form a region of the thin film where the crystals can grow freely in surface and thickness. The result is a rather monocrystalline structure of the thin film in this region. Usually, the region with the polycrystalline crystal structure of the thin film is substantially thicker than the region with the monocrystalline structure. Frequently, the region with the polycrystalline structure extends over the entire thickness of the thin film, as the foreign substrate dissipates heat much faster than the exposed surface of the thin film, thereby accelerating the crystallization rate from the foreign substrate towards the inside of the thin film.

Also, in the 'string ribbon' method by Evergreen Solar, step c) of the invention is not fulfilled, because when the sheets are extracted from the liquid silicon bath, the sheets are coated on one side only, and consequently upon cooling, a similar crystallization process and temperature curve as described in the previous section. The same is true for methods in which a substrate sheet or plate is pulled through at the underside of a liquid silicon bath in the horizontal direction, and thus a thin liquid silicon layer is applied to the sheet.

Figure 2:
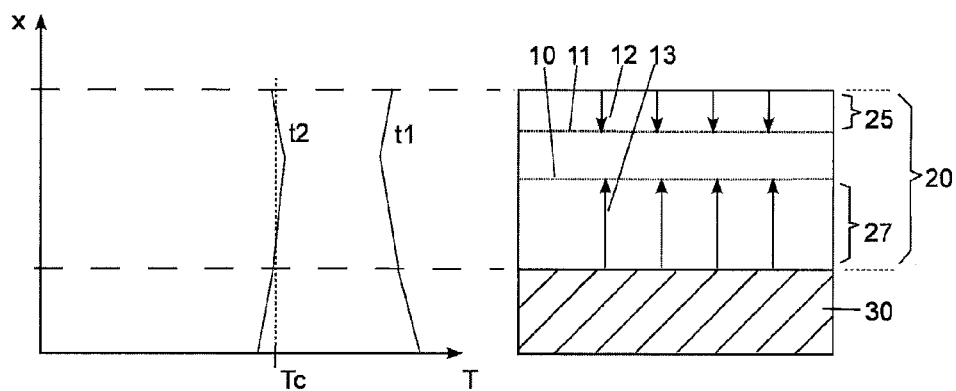
FIG. 2 is illustrative of a temperature curve through the semiconductor thin film of prior art methods.

FIG. 2 shows the typical temperature curve for said prior methods above the coordinate x straight through the semiconductor thin film 20, the two directions of crystallization 12 and 13, the two crystallization fronts 10 and 11, and the two regions 25 and 27 of different crystal structure, at a time t1 when the entire semiconductor thin film has melted, and at a later time t2 while the temperature T is slowly decreased to slightly below the melting temperature Tc, when the thin film begins to solidify at the border to the foreign substrate and at the same time on the exposed surface of the thin film.

Consequently, none of the prior methods mentions step c) of the invention, neither together with step b). In fact, the German patent document 1 223 951 includes steps a) and b), but step c) is not mentioned. Only heating of the thin film up to melting is mentioned, but not the direction in which the thin film crystallizes or solidifies. Lines 47-54 on page 4 of the specification mention high frequency heating of the base material, the base being supported on a graphite block, and heating of the layer being performed progressively from edge to edge. As the graphite block is a good electric and thermal conductor, zone melting cannot take place locally from edge to edge by heat transfer from the graphite block onto the thin film, but only if the heat is acting precisely locally from above the exposed surface of the thin film onto the thin film. In this case, the graphite block rather acts like an electrode for high-frequency heating. However, as explained above, upon cooling this causes the surface of the semiconductor thin film to be continuously at a higher temperature than the surface of the supporting material, thus in contrast to step c) of the invention.

The German patent document DE 41 40 555 A1 includes an arrangement of two heat sources 6 and 7 for heating a semiconductor thin film on a substrate, wherein heat source 6 is attached below and heat source 7 is attached above the substrate or the semiconductor thin film. From the description of the arrangement in this document, it is clearly apparent that the temperature curve according to step c) of the present invention cannot be reached by the procedure described in said document. In this respect, reference is made to the following location in the description of document (1) (cf. (1) col. 7/lines 2-34):

"First, as shown in FIG. 1(b), the base 2 is heated by a first heater 6 . . . up to the melting point or above . . . . Then, as shown in FIG. 1(b), the semiconductor layer 1 is heated by a second heater 7 . . . so as to be melted and re-crystallized, and the melted region is moved so as to successively melt and re-crystallize the entire semiconductor layer according to the movement of the second heater."

From the above, the following can be clearly derived:

1. Heater 6 is not used for melting and re-crystallizing the semiconductor layer 1, but only heater 7 is used for this purpose.

2. During melting and re-crystallization of the semiconductor layer 1, heater 6 is only used for maintaining the base 2 in the melted state, namely at a temperature below the melting temperature of the semiconductor layer 1, so that no strains and irregularities appear during re-crystallization in the semiconductor layer 1 and uniformity of the temperature in the semiconductor layer is improved during re-crystallization (cf. (1) col. 5/lines 46-54).

3. However, as according to FIG. 1(b), heater 7 applies heat to the semiconductor layer 1 from above, it is thus apparent from the previous items 1 and 2 by means of the basic laws of thermal conductivity that upon melting of the semiconductor layer 1 a temperature curve proceeding from plate 11 towards the base 2 will appear qualitatively as represented in FIG. 2 of the present invention at the time t1. If the heating power of heater 7 is reduced in order to allow for re-crystallization, then a temperature curve will result as represented in FIG. 2 of the present invention at the time t2. A detailed description of this temperature curve can be found in the description of the patent application (cf. page 3/line 24-page 4/line 20, page 4/line 28-page 5/line 3). However, this temperature curve is opposite to the temperature curve of step c) of the present invention.

The German examined and published patent application 1521465 and the published patent application 2536174 describe base plates and foreign substrates which are heated by direct current passage or by a heat source attached to the underside of the base plate. The temperature curve ensured by step c) of the invention through the thin film is thus indeed fulfilled, but not explicitly mentioned in said documents because the positive influence on crystallization was not known. This also accounts for the fact that in said documents, it is explicitly mentioned that either vapor deposition of the thin film or annealing of the thin film is performed respectively below the melting temperature of the thin film. As a result, steps b) and c) of the invention cannot be fulfilled at the same time. However, step b) is a prerequisite for the positive influence of step c) on crystallization even to occur. The same is true for all of the prior production methods which are implemented in hot wall reactors.

Within the scope of the invention, suitable foreign substrates are thin-walled plates, sheet metal, or sheets made of ceramics, glass, graphite, or metal, wherein the melting temperature of the foreign substrate is to be higher than that of the semiconductor thin film in order to prevent penetrating and mixing of the semiconductor material with the foreign substrate, although this may not be absolutely necessary. Consequently, as a metal for the foreign substrate, iron, titanium, chromium, molybdenum, or alloys of said materials are suitable in particular for economical reasons. Herein, the surface of the foreign substrate may be planar or curved.

The invention is not limited to thin films of any given semiconductor material. For economical reasons, in particular silicon, silicon carbide, III-V semiconductors, such as aluminum antimonite for example, or ternary semiconductors, such as copper indium selenide for example, are suitable. However, during the melting process in binary and ternary semiconductor materials, segregation or dissociation of the elements may occur which may limit the applicability of the method for such semiconductors.

Another advantageous step within the scope of the invention is the application of several semiconductor thin films lying on top of each other, wherein each semiconductor thin film may be composed of a different semiconductor material or different doping. This can be of advantage in particular for the production of differently doped semiconductor thin films or for the production of tandem solar cells. In principle, there are two options for the application of steps a) to c) of the invention.

The first option is to apply steps a) to c) of the invention separately for each semiconductor thin film. I.e., a first semiconductor thin film is applied to the foreign substrate by means of vapor deposition, and steps b) and c) are performed. Then, a second semiconductor thin film is applied to the first thin film produced according to steps a) to c), and steps b) and c) are repeated for the second thin film. Said steps are repeated for each further semiconductor thin film applied. In this case, it is common in the production of tandem solar cells, for the lowermost thin films to be made of silicon, and for thin films located higher up to be made of a semiconductor material having a higher band gap, e.g. aluminum antimonite (melting temperature 1050° C., band gap 1.6 eV) or gallium arsenide (melting temperature 1238° C., band gap 1.4 eV).

The second option is to apply steps a) to c) of the invention for all semiconductor thin films applied together. I.e., several thin films are applied one after the other to the foreign substrate, e.g. by means of vapor deposition. Next, the temperature of the foreign substrate is set high enough to melt all thin films applied together. Next, the temperature of the foreign substrate is slowly decreased so that first the uppermost thin film solidifies, then the thin film located below, then the next deeper thin film, etc., down to the lowermost thin film. This option can be advantageous in particular if the thin films are composed of the same semiconductor material, but have different doping, or if thin films located higher up consist of a semiconductor material the melting temperature $Tc1$ of which is below the melting temperature $Tc2$ of the semiconductor material of lower thin films, thus if $Tc1<Tc2$.

Doping of the semiconductor thin film is usually performed by means of vapor deposition of a reactive gas containing the dopant. For n doping, e.g. phosphine or ammonium, for p doping, e.g. Diboran can be used. Said gases are admixed in the adequate concentration to the carrier gases and the reactive gases containing the semiconductor substances.

Within the scope of the invention, it can be advantageous to use graphite sheets as a foreign substrate for producing thin films from silicon. Before coating with semiconductor material, argon gas or hydrogen gas can be flowed at increased temperature, e.g. 900° C., over the graphite sheet in order to improve the surface finish of the graphite sheet. It may also be advantageous for the graphite sheet to be provided with a highly doped intermediate layer of silicon carbide (SiC). On the one hand, said intermediate layer ensures electric contact between silicon thin film and graphite sheet, and on the other hand prevents a semiconductor material applied later from penetrating or diffusing into the graphite sheet. For the production of this intermediate layer from SiC, several methods are known, e.g. the methods described in the German published patent application 2536174. Similarly, amorphous boundary layers, which are created upon cooling at the interface with the foreign substrate or between different thin films, can be highly doped in order to ensure electric contact between the layers.

Once one or more superposed silicon thin films have been produced on the foreign substrate, e.g. a graphite sheet, according to steps a) to c) of the invention, it is indicated to grow one or more thin films of SiC on the uppermost silicon thin film by means of hetero-epitaxy. It is also possible for a first thin film of SiC to be grown on the uppermost silicon thin film by hetero-epitaxy, and any further thin film of SiC to be grown by homo-epitaxy.

As an alternative to epitaxy, it is also possible to produce a high quality SiC thin film by a CVD method with subsequent annealing of the deposited layer at high temperature, e.g. above 1350° C. In order to obtain SiC single crystals as large as possible, the following two steps are performed:

g) annealing and the subsequent cooling process must fulfill step c) of the invention, h) homogeneity of the deposited layer should deviate as little as possible from the stoichiometric mixing ratio 1:1.

From the analysis of hetero-epitaxy of SiC thin films on Si substrates, it is known that the SiC single crystals of an SiC thin film can be created by secondary diffusion of Si atoms to the surface through an SiC layer already formed. In this case, Si atoms may diffuse through an SiC layer having a maximum thickness of 10-20 nm. This characteristic also allows for healing crystal defects by annealing at high temperatures. Step h) is to prevent that during annealing Si atoms have to cover a distance of more than 10-20 nm by diffusion in order to compensate for slight local variations in homogeneity and allow for healing of crystal defects. Step h) can be obtained by adequately setting the mixing ratio of the reactive gases used in a CVD method for silicon and carbon, e.g. silane and propane. Good results can be obtained for example with a mixing ratio of silane to propane of 4 Si atoms to 6 C atoms. Step g) promotes unhindered growth and orientation of the SiC single crystals from the surface of the thin film towards the foreign substrate. As already explained above, crystal growth in close proximity to the boundary surface to the silicon substrate is hindered so that a thin amorphous boundary layer of SiC is formed there. Prior methods and commercially available ovens for annealing of SiC thin films on planar foreign substrates mostly use induction heating. However, as explained above, with this type of heating, due to the one-sided coating of the foreign substrate, steps c) and g) of the invention cannot be fulfilled upon cooling. The method described above for the production of SiC thin films can be applied unchanged to other semiconductor materials having a higher melting temperature, such as aluminum phosphide or aluminum nitride, for example.

By applying an SiC thin film to an Si thin film, it is possible to produce tandem solar cells from silicon and silicon carbide. The diffusion barrier of silicon through an SiC thin film, described above, prevents mixing of the silicon thin film and the SiC thin film, even above the melting temperature of silicon. Herein, the amorphous intermediate layer which is created at the interface of the Si thin film and the SiC thin film appropriately serves for compensating material stresses created due to the different coefficients of thermal expansion of both layers during the cooling process. Furthermore, said intermediate layer can be highly doped in order to ensure the electric contact between the SiC thin film and the Si thin film. Moreover, said amorphous SiC thin film is highly transparent for the long-wave light absorbed in the Si thin film.

In principle, it is possible to place further thin films made of a semiconductor material with an even higher band gap, e.g. of aluminum nitride, on the thin films of SiC.

Regarding step b) of the invention, depending on the semiconductor material, it may be necessary for the temperature of the semiconductor thin film to be decreased as fast as possible to the normal temperature or to be actively cooled in order to prevent segregation or dissociation of certain elements of the semiconductor material.

Figure 3:
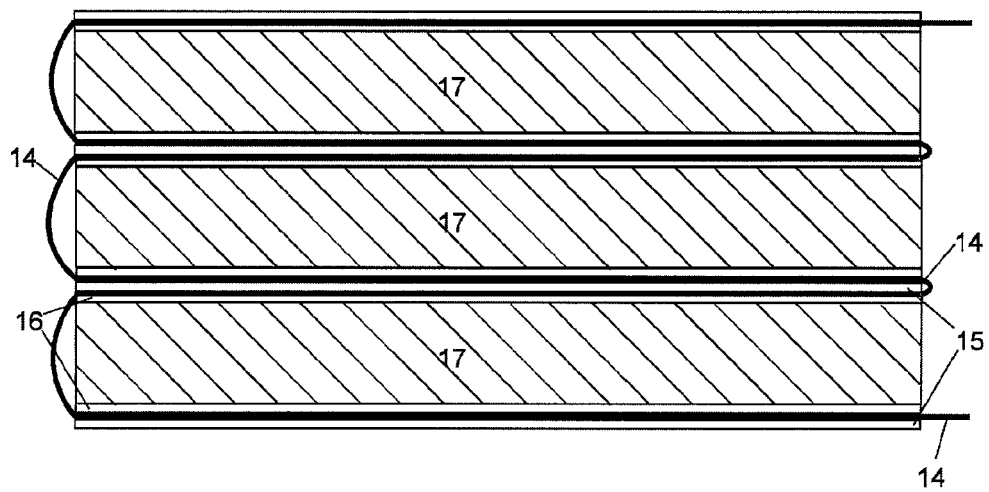
FIG. 3 is a side elevational view of the carrier structure of the present invention.
Figure 4:
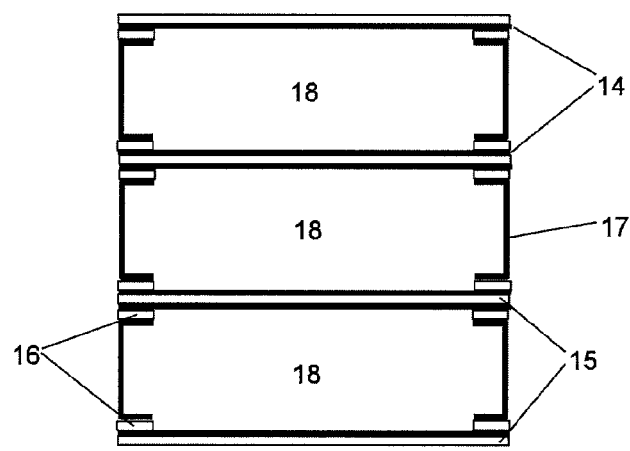
FIG. 4 is a cross-sectional view of the carrier structure of the present invention.
Figure 5:
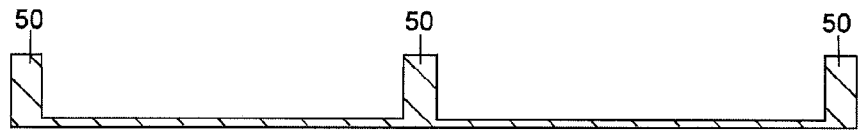
FIG. 5 is a top plan view from above of a U-shaped rail where the legs have been removed except for three points of support 50 respectively.
Figure 6:
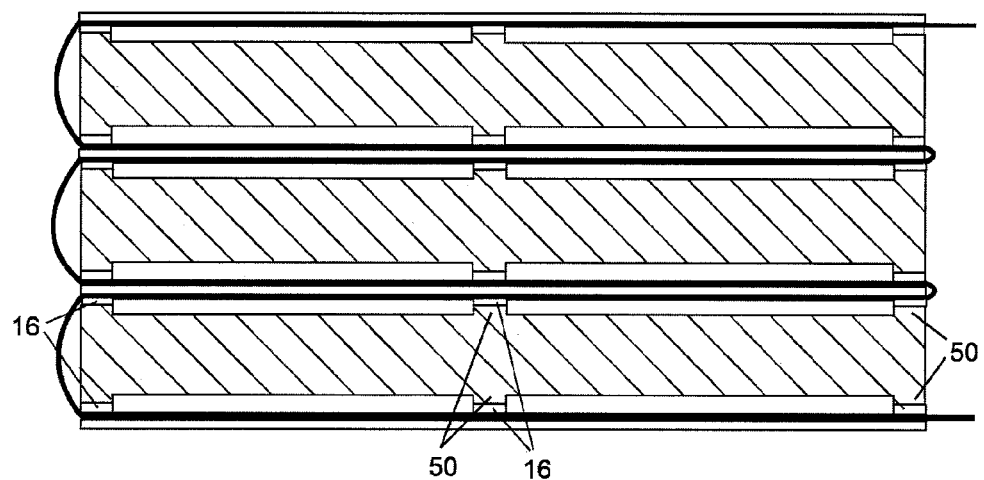
FIG. 6 is a side elevational view of the carrier structure with U-shaped rails and ceramic strips reduced except for the supporting points 50.

FIG. 3 and FIG. 4 show another advantageous step within the scope of the invention. An electrically conductive sheet acting as a foreign substrate extends via a suitable carrier structure in parallel on several planes on top of each other. FIG. 3 shows the side view of the carrier structure, with FIG. 4 showing the cross-section. In this case, advantageously, the carrier structure is to be light-weight and dimensionally stable over the entire temperature range, e.g. between 0 and 2000° C. in order to allow for fast and homogeneous heating and cooling. Herein, the carrier structure consists of U-shaped rails 17 made of carbon fiber. The U-shaped rails 17 are electrically insulated from the next higher and lower U-shaped rails and from the conductive sheet 14 by means of thin plates 15 made of ceramics and by means of thin strips 16 made of ceramics. Instead of plates 15 and strips 16, a ceramic fabric can be used, too. Between two planes of the carrier structure, there is one cavity 18, respectively. Advantageously, strips 15 and U-shaped rails 17 may also have cross braces for additional support of the sheet 14. It is also possible for the sheet 14 to be divided into several segments, e.g. a separate film for each plane, and for each segment to be connected separately to an electric heat source. Since when the temperature is decreased by step c) of the invention the heat always flows from the inside of the carrier structure to the outer sides thereof, the temperature consequently decreases from the inside of the carrier structure to the outside. As a result, when the temperature is decreased, the edges of the carrier structure, and thus also the graphite sheet, may have a slightly lower temperature than on the inside, and thus solidification or crystallization of the thin film first starts at the edges of the graphite sheet and then moves inwards. Thereby, according to FIG. 3 and FIG. 4, the edges of the graphite sheet adjacent to the ceramic strips could have an adverse effect on the crystal structure of the thin film. In order to counteract this influence, it may be necessary, as shown in FIG. 5 and FIG. 6, for the ceramic strips 16 to be reduced to a few narrow supporting points 50 only. In addition, the legs of the U-shaped rails can be removed except for said points of support. FIG. 5 shows the top view from above of such a U-shaped rail where the legs have been removed except for three points of support 50, respectively. FIG. 6 shows a side view of the carrier structure with such U-shaped rails and ceramic strips reduced except for the supporting points 50.

As also described in the German examined and published patent application 1521465, it is equally possible for the electrically conductive sheet to be used only as a heat source, and to take another sheet as a foreign substrate for coating. If the sheet acting as a foreign substrate is also electrically conductive, then the sheets must be electrically insulated from each other by means of a further thin ceramic layer. Additional steps may be required if penetration of the reactive gases between the sheets and the insulating layers is to be avoided.

Figure 7:
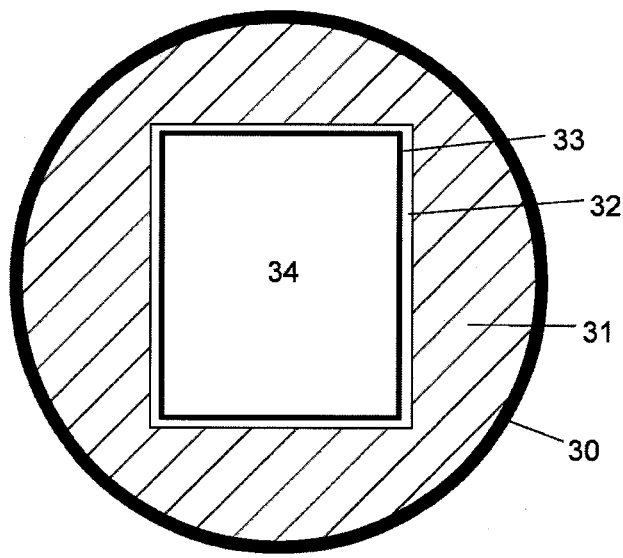
FIG. 7 is a cross-sectional view of a cylindrical CVD reactor.
Figure 8:
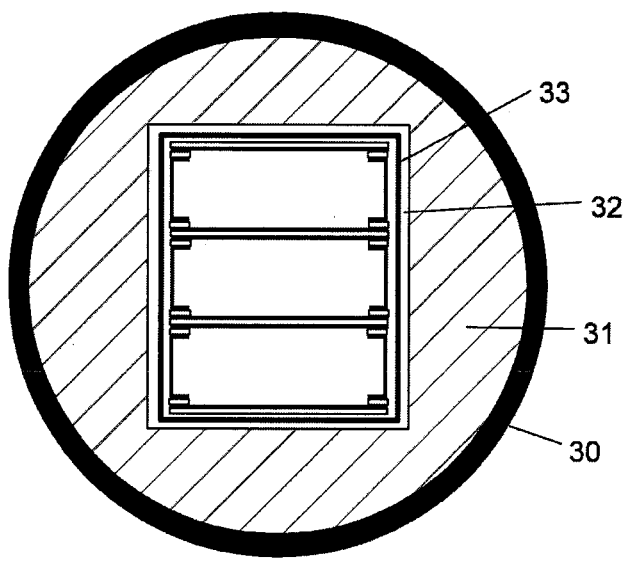
FIG. 8 is another cross-sectional view of the same cylindrical CVD reactor with the carrier structure represented in FIG. 4 placed inside the cavity 34 of the CVD reactor.

Using the above-described carrier structure allows for better use of the volume of space available for vapor deposition inside a cylindrical reaction vessel, e.g. in a cylindrical CVD reactor, while maximizing the available surface of the foreign substrate to be coated. FIG. 7 shows the cross-section of a cylindrical CVD reactor designed for high temperatures and accommodating a carrier structure as described above. The reactor consists of a cylinder jacket 30 made of a steel alloy, a thermally insulating ceramic case 31, an additionally thermally insulating layer of ceramic fabric 32, and a housing 33 made of thin-walled ceramic plates used for shaping the ceramic fabric 32. Cavity 34 having a rectangular cross-section is used for accommodating a carrier structure as described above, wherein the cross-sectional area of the cavity 34 and the cross-sectional area of the carrier structure should advantageously match as accurately as possible. For the purpose of illustration, FIG. 8 shows the same cylindrical CVD reactor with the carrier structure represented in FIG. 4 placed inside the cavity 34 of the CVD reactor. Due to the use of said carrier structure, in which the sheet serving as a foreign substrate extends on several planes above each other, homogeneous vapor deposition of the semiconductor material becomes very difficult because of overflowing of the sheet by reaction and carrier gases. Consequently, in this case, it is advantageous for the combination of the following steps to be carried out:

d) prior to deposition, the reaction and carrier gases are introduced into the reactor in a given quantity and up to reaching a given pressure;

e) next, vapor deposition is carried out, with the inlets and outlets of the reactor being closed during deposition;

f) when deposition is completed, the residual gases are removed or discharged from the reactor.

Step d) ensures that all of the cavities located between the planes of the carrier structure will be filled homogeneously with reaction and carrier gases. Step e) ensures that during deposition, no major gas streams will occur within and between the cavities 18 of the carrier structure. Thereby, deposition on each plane and in each cavity of the carrier structure is performed homogeneously over the entire surface of the foreign substrate on this plane. Herein, the amount of the semiconductor material deposited on a plane of the carrier structure is determined by the volume of the cavity 18 located on this plane and the pressure set in step d). The pressure set in step d) can well be several bars above atmospheric pressure. In vapor deposition, e.g. at 300-400° C. according to step e), the pressure in the CVD reactor may further increase due to decomposition of the reactive gases into other gases, e.g. double for silane into hydrogen according to $SiH_4 \rightarrow Si + 2H_2$. According to FIG. 7, the cylinder jacket 30 of the CVD reactor must be dimensioned accordingly.

The invention claimed is:
1. A method for producing semiconductor thin films, characterized by the combination of the following steps:

a) on a foreign substrate, a thin layer of polycrystalline semiconductor material is applied;
b) the foreign substrate is heated to such an extent that the semiconductor thin film melts at a temperature above the melting temperature of the semiconductor thin film, whereafter the temperature is slowly decreased to below the melting temperature of the semiconductor thin film and until solidification of the semiconductor thin film, and then further down to normal temperature;
c) when the temperature is decreased to below the melting temperature of the semiconductor thin film, the foreign substrate is heated, wherein a heat source is attached in a planar fashion directly to the uncoated surface of the foreign substrate, or wherein the foreign substrate is heated by direct electric current passage, so that the temperature, starting from the contact surface of the foreign substrate with the thin film, continuously decreases in the vertical direction straight through the semiconductor thin film up to the surface of the thin film.

2. The method according to claim 1, characterized in that the foreign substrate consists of a thin-walled plate or sheet having a planar or curved surface.

3. The method according to claim 1, characterized in that before the thin layer of polycrystalline semiconductor material is applied, the foreign substrate is already provided with a semiconductor thin film.

4. The method according to claim 3, characterized in that the semiconductor thin films lying on top of each other consist of different semiconductor materials and can be provided with different doping.

5. The method according to claim 1, characterized in that the application of a thin film polycrystalline semiconductor material on the foreign substrate in a reaction pressure vessel is performed by vapor deposition and the combination of the following steps:

d) prior to deposition, the reaction gases are introduced into the reaction pressure vessel in a given quantity and up to reaching a given pressure;
e) next, vapor deposition is carried out, with the inlets and outlets of the reaction pressure vessel being closed during deposition;
f) when deposition is completed, the residual gases are discharged from the reactor.

6. The method according to claim 5, characterized in that one or more separate sheets serving as a foreign substrate extend one above the other on several planes by means of a suitable carrier structure.

7. The method according to claim 1, characterized in that heating of the foreign substrate is performed by direct current passage through the foreign substrate.

8. A method for producing semiconductor thin films, characterized by the combination of the following steps:
g) on a foreign substrate, a homogeneous thin polycrystalline SiC layer is applied;
h) annealing of the layer is performed at a temperature above 1000° C.; then, the temperature is slowly decreased;
i) during annealing and during the subsequent cooling process, the foreign substrate is heated wherein a heat source is attached in a planar fashion directly to the uncoated surface of the foreign substrate, or wherein the foreign substrate is heated by direct electric current passage, so that the temperature continuously decreases starting from the contact surface of the foreign substrate with the thin film, in the vertical direction straight through the semiconductor thin film up to the surface of the thin film.

9. The method according to claim 8, characterized in that prior to the application of the thin polycrystalline SiC layer the foreign substrate is already provided with a semiconductor thin film.

* * * * *